United States Patent
Johnson et al.

(10) Patent No.: US 11,456,049 B2
(45) Date of Patent: Sep. 27, 2022

(54) MEMORY DEVICE TESTING, AND ASSOCIATED METHODS, DEVICES, AND SYSTEMS

(71) Applicant: Micron Technology, Inc., Boise, ID (US)

(72) Inventors: Jason M. Johnson, Boise, ID (US); Dennis G. Montierth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 153 days.

(21) Appl. No.: 16/919,922

(22) Filed: Jul. 2, 2020

(65) Prior Publication Data
US 2022/0005541 A1 Jan. 6, 2022

(51) Int. Cl.
| G11C 29/00 | (2006.01) |
| G11C 29/44 | (2006.01) |
| G11C 29/48 | (2006.01) |
| G11C 29/42 | (2006.01) |
| G11C 29/46 | (2006.01) |

(52) U.S. Cl.
CPC .............. *G11C 29/44* (2013.01); *G11C 29/42* (2013.01); *G11C 29/46* (2013.01); *G11C 29/48* (2013.01)

(58) Field of Classification Search
CPC ......... G11C 29/44; G11C 29/42; G11C 29/46; G11C 29/48
See application file for complete search history.

(56) References Cited

U.S. PATENT DOCUMENTS

| 6,499,118 B1* | 12/2002 | Michaelson ............ H01L 22/22 714/711 |
| 2003/0116763 A1* | 6/2003 | Yamazaki ............ G11C 29/1201 257/48 |

OTHER PUBLICATIONS

Amrie Bin Shaari et al., U.S. Appl. No. 16/782,949, titled Microelectronic Device Testing, and Associated Methods, Devices, and Systems, filed Feb. 5, 2020.

* cited by examiner

*Primary Examiner* — Tuan T Nguyen
(74) *Attorney, Agent, or Firm* — TraskBritt

(57) ABSTRACT

Methods of testing memory devices are disclosed. A method may include reading from a number of memory addresses of a memory array of the memory device and identifying each memory address of the number of addresses as either a pass or a fail. The method may further include storing, for each identified fail, data associated with the identified fail in a buffer of the memory device. Further, the method may include conveying, to a tester external to the memory device, at least some of the data associated with each identified fail without conveying address data associated with each identified pass to the tester. Devices and systems are also disclosed.

20 Claims, 8 Drawing Sheets

| BC | F/P | Fail Encoded Information <8:0> / Pass Count <8:0> | | | | | | | | |
|---|---|---|---|---|---|---|---|---|---|---|
| 6 | | | | | | | | | | |
| 5 | | | | | | | | | | |
| 4 | | | | | | | | | | |
| 3 | 0 | | | 0 | 0 | 0 | 0 | 0 | 0 | 1 |
| 2 | 1 | | | V | V | V | V | V | V | V |
| 1 | 0 | | | 0 | 0 | 0 | 0 | 0 | 1 | 1 |
| 0 | 1 | | | V | V | V | V | V | V | V |

400

| Serial Data Out Register | |
|---|---|
| 1 | V |

MEMORY DEVICE TESTING, AND ASSOCIATED METHODS, DEVICES, AND SYSTEMS

TECHNICAL FIELD

Embodiments of the disclosure relate generally to memory device testing. More specifically, various embodiments relate to methods of testing memory devices, and to related devices and systems. Yet more specifically, some embodiments relate to processing, storing, and/or conveying memory device test data to a tester.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory.

Memory devices typically include many memory cells that are capable of holding a charge that is representative of a bit of data. Typically, these memory cells are arranged in a memory array. Data may be written to or retrieved from a memory cell by selectively activating the memory cell via an associated word line driver.

BRIEF DESCRIPTION OF THE DRAWINGS

FIGS. 4A and 4B are example illustrations depicting snapshots of data within a buffer of a memory device, in accordance with one or more embodiments of the present disclosure.

DETAILED DESCRIPTION

Figure 1:
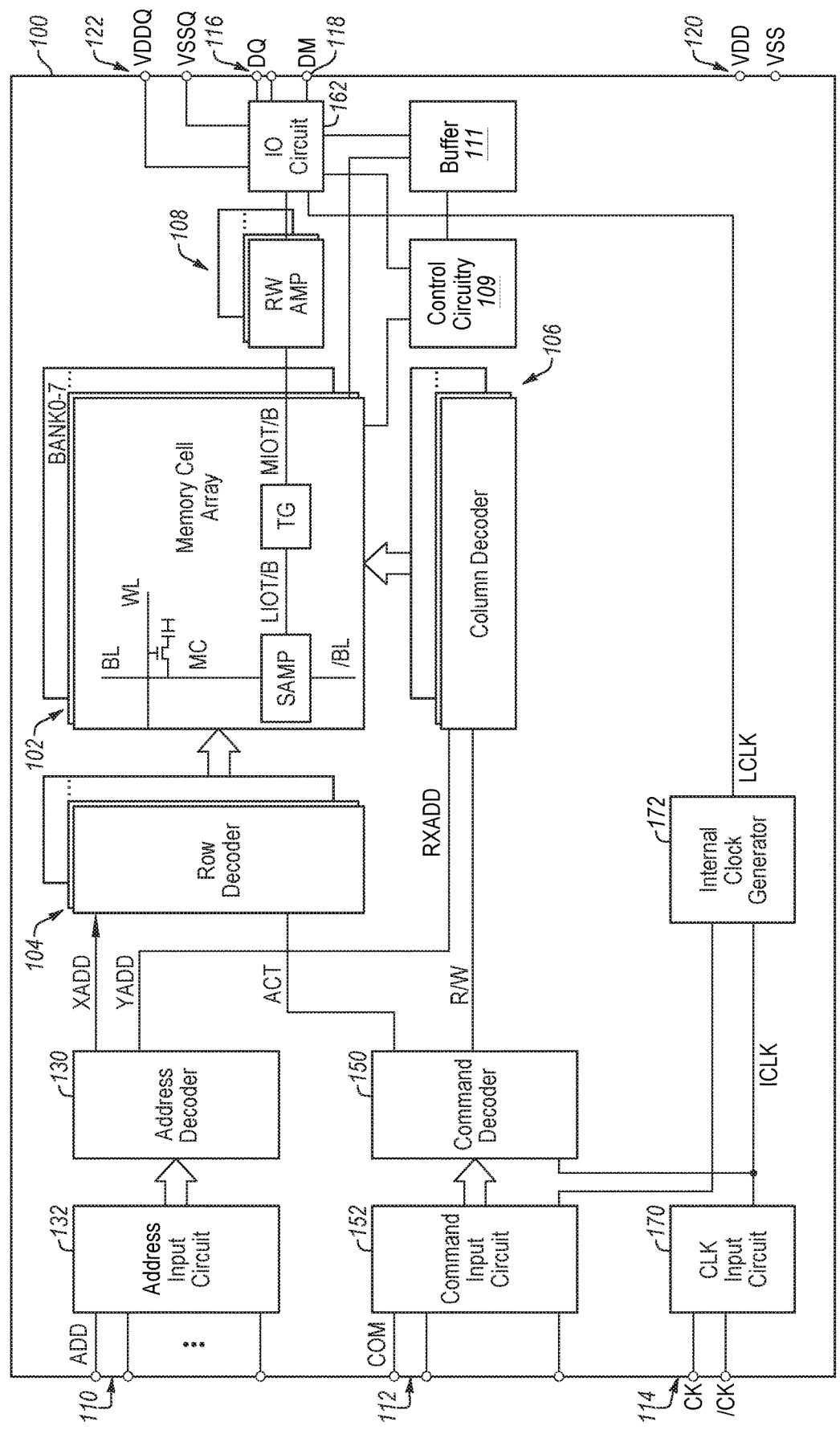
FIG. 1 is a block diagram of an example memory device, in accordance with at least one embodiment of the present disclosure.

A semiconductor memory device typically includes an array of memory cells. Memory cells in the array are selected for reading and writing by means of row and column address signals input to the memory device. The row and column address signals are processed by address decoding circuitry to select row lines and column lines in the array to access the desired memory cell or memory cells (i.e., at one or more identified memory addresses).

In the manufacture of semiconductor memory devices, integrated circuits are formed on wafers, which typically include a number of integrated circuits. The functionality of the integrated circuits is then tested, or probed, while the circuits are still on the wafer. Each wafer is then cut into pieces, or dies, with a diamond saw. Each die represents one integrated circuit. A die that does not pass wafer testing is either discarded or reworked to restore the functionality of the circuits. Dies that pass wafer level testing are usually mounted on a lead frame and encapsulated with a plastic compound to form a semiconductor device. However, the die may be mounted and encapsulated at a later time, after further testing is performed on the die.

Electrical tests are then typically performed on each device. Following this initial testing, burn-in tests are usually performed on each of the devices. Burn-in testing involves testing the devices at high temperatures, usually exceeding 100 degrees Celsius, for a length of time typically exceeding 24 hours. The environmental stress applied to the devices during burn-in testing is much greater than the devices will typically encounter under normal operation. Therefore, burn-in testing identifies defects in the devices that may cause early semiconductor device failures. Burn-in testing typically cannot test the devices at their maximum operating speeds and cannot perform other discrete tests on the devices. Thus, the devices typically undergo another series of electrical tests.

One conventional method of testing a memory device is to have an external testing device (also referred to herein as a "tester") write data to every memory cell of the memory device, read data from every memory cell, and compare the input with the output. Such a comparison may reveal cells that failed to store the data properly. To salvage a semiconductor memory device despite defective memory cells, and thus to increase overall yield in the manufacturing process, redundancy is commonly implemented. Redundant memory cells are located in the memory array and the memory array may be associated with a number of redundant memory cells. When a defective memory cell is detected in the array, redundant decoding circuitry associated with the redundant memory cells may be programmed (e.g., via fuse, antifuse, or other programming techniques) to respond to the address of the defective memory cell. When the address of the defective memory cell is selected for access, the redundant memory cell may be accessed (e.g., read from or written to) rather than the defective memory cell.

During at least some testing phases, large numbers of electrical tests are performed on a large number of integrated circuits on wafers or on a large number of packaged semiconductor devices via integrated circuit testers. Due to the large numbers, test times for a production run of a semiconductor memory device may be long and may thus increase manufacturing costs.

As described more fully below, various embodiments disclosed herein relate to testing memory devices, and more specifically to processing test data, storing the test data within a buffer, and/or conveying the test data to a tester. More specifically, according to some embodiments, a method of testing a memory device may include reading from a number of memory addresses of a memory array of the memory device and identifying each memory address of the number of addresses as either a pass or a fail. The method may further include storing, for each identified fail, data associated with the identified fail in a buffer of the memory device. Further, the method may include conveying, to a tester external to the memory device, at least some of the data associated with each identified fail without conveying address data associated with each identified pass to the tester. Compared to conventional methods, devices, and systems, various embodiments of the present disclosure may reduce testing time and/or reduce use of input/output (I/O) resources of a memory device and/or an associated memory system.

Although various embodiments are described herein with reference to memory devices, the present disclosure is not so limited, and the embodiments may be generally applicable to microelectronic devices that may or may not include semiconductor devices and/or memory devices. Embodiments of the present disclosure will now be explained with reference to the accompanying drawings.

FIG. 1 includes a block diagram of an example memory device 100, according to various embodiments of the present disclosure. Memory device 100 may include, for example, a DRAM (dynamic random access memory), a SRAM (static random access memory), a SDRAM (synchronous dynamic random access memory), a DDR SDRAM (double data rate DRAM, such as a DDR4 SDRAM and the like), or a SGRAM (synchronous graphics random access memory). Memory device 100, which may be integrated on a semiconductor die, may include a memory cell array 102.

In the embodiment of FIG. 1, memory cell array 102 is shown as including eight memory banks BANK0-7. More or fewer banks may be included in memory cell array 102 of other embodiments. Each memory bank includes a number of access lines (word lines WL), a number of data lines (bit lines BL and /BL), and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 108 over complementary local data lines (LIOT/B), transfer gate (TG), and complementary main data lines (MIOT/B). Conversely, write data outputted from read/write amplifiers 108 may be transferred to sense amplifier SAMP over complementary main data lines MIOT/B, transfer gate TG, and complementary local data lines LIOT/B, and written in memory cell MC coupled to bit line BL or /BL.

Memory device 100 may be generally configured to be receive various inputs (e.g., from an external controller) via various terminals, such as address terminals 110, command terminals 112, clock terminals 114, data terminals 116, and data mask terminals 118. Memory device 100 may include additional terminals such as power supply terminals 120 and 122.

During a contemplated operation, one or more command signals COM, received via command terminals 112, may be conveyed to a command decoder 150 via a command input circuit 152. Command decoder 150 may include a circuit configured to generate various internal commands via decoding one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and the bit line BL specified by column address YADD may be selected.

In response to active command ACT, a read signal, a row address XADD, and a column address YADD, data may be read from memory cell MC specified by row address XADD and column address YADD. The read data may be output via a sense amplifier SAMP, a transfer gate TG, read/write amplifier 108, an input/output circuit 162, and data terminal 116. Further, in response to active command ACT, a write signal, a row address XADD, and a column address YADD, write data may be supplied to memory cell array 102 via data terminal 116, input/output circuit 162, read/write amplifier 108, transfer gate TG, and sense amplifier SAMP. The write data may be written to memory cell MC specified by row address XADD and column address YADD.

Clock signals CK and /CK may be received via clock terminals 114. A clock input circuit 170 may generate internal clock signals ICLK based on clock signals CK and ICK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When data mask signal DM is activated, overwrite of corresponding data may be prohibited.

As described more fully below, according to some embodiments, memory device 100 may include control circuitry 109 and a buffer 111. In some embodiments, during testing of memory device 100, control circuitry 109 and/or other circuitry of memory device 100 may be configured to read data from a number of memory addresses of memory cell array 102, compare the read data to known test data (e.g., data written to memory cell array 102 and/or known data (e.g., stored in one or more internal registers)), and responsive to the comparison, identify each memory address of the number of memory addresses as either a pass or a fail. In other words, memory addresses associated with defective ("bad") memory cells may be identified as a "fail," and memory addresses associated with functional ("good") memory cells may be identified a "pass." Further, control circuitry 109 and/or other circuitry of memory device 100 may be configured to store, for each identified fail, data associated with the identified fail in buffer 111, and convey, to an external tester (not shown in FIG. 1, see FIG. 3), at least some of the data associated with each identified fail without conveying address data associated with each identified pass to the external tester.

Figure 2:
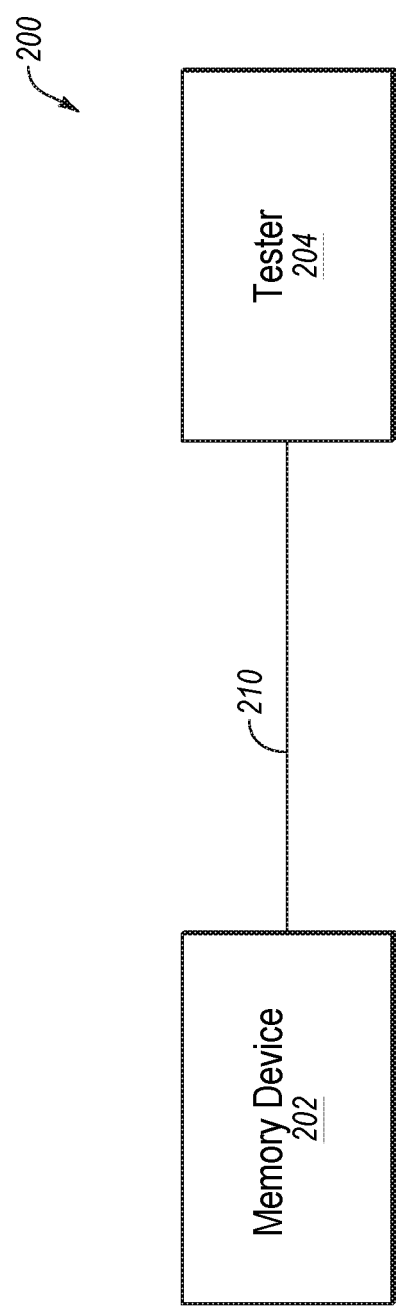
FIG. 2 depicts an example system including a memory device and a tester.

FIG. 2 depicts an example system 200 including a memory device 202 and a tester 204. Conventionally, during testing of memory device 202, data associated with for both passing and failing bits (i.e., data associated with both passing and failing memory addresses) (e.g., 1 bit per memory cell or a compressed group of cells (e.g., of up to 138×)) is conveyed from memory device 202 to tester 204 via input/output (I/O) line 210. Further, in this example, tester 204 requires sufficient memory to log both passing and failing bits. As will be appreciated, usually, a majority of bits of a memory device are "good" (i.e., passing) bits. For example, in one scenario (e.g., a worst case scenario), only 1 of 3729 output reads (e.g., less than 0.027%) may result in a fail. Thus, as will be appreciated, during testing of memory device 202, the majority of data being transferred from memory device 202 to tester 204 via I/O line 210 is related to passing bits ("pass data"). As will also be appreciated, transferring large amounts of data via I/O line 210 limits the efficiency of a testing process (e.g., limits read speed) and undesirably uses I/O resources of memory device 202 and/or an associated memory system.

In some conventional memory device testing methods, such as global column repair (GCR), each column plane of a memory array of a memory device may generate a number (e.g., 8) of bits. If each bit generated via a column plane has a first state (e.g., a "0"), the column plane "passes" a test (i.e., the column plane does not include any defective memory cells), and if the column plane generates one or more bits having a second state (e.g., a "1"), the column plane "fails" the test (i.e., the column plane includes one or more defective memory cells). Further, each row of the memory array may include a number of redundant memory cells accessible via redundant column select (RCS) lines. Further, if one or more memory cells accessible via a column select line X of a column plane of a row fails, the one or more memory cells accessible via column select line X may be replaced with one or more memory cells accessible via a column select address X of a redundant column plane.

Global column repair may provide yield and/or die-size advantages. However, global column repair may cause some concerns related to timing and/or size requirements. Further, if error-correcting code (ECC) is used (i.e., to correct single bits, "single bit forgiveness"), full visibility (i.e., 1× visibility) may be required to determine which specifics bits are failing. As will be appreciated, this additional visibility may increase the amount of data per fail, even more than current global column repair proposals. Other conventional testing solutions may limit the amount and/or speed of data that can be read out of a single die (e.g., due to shared I/O lines (e.g., on a burn-in board (BIB))).

As noted above, various embodiments disclosed herein related to processing, storing, and/or reading out test data, wherein data associated with failing memory addresses is read out (e.g., from a memory device to a tester) and it is not required to read out data associated with a passing address. Thus, in comparison to conventional methods, devices, and systems, various embodiments may reduce an amount of data transferred from a memory device to a tester. Accordingly, in comparison to conventional methods, devices, and systems, various embodiments may reduce the time required and/or I/O resources used to read out data during a testing operation.

Figure 3:
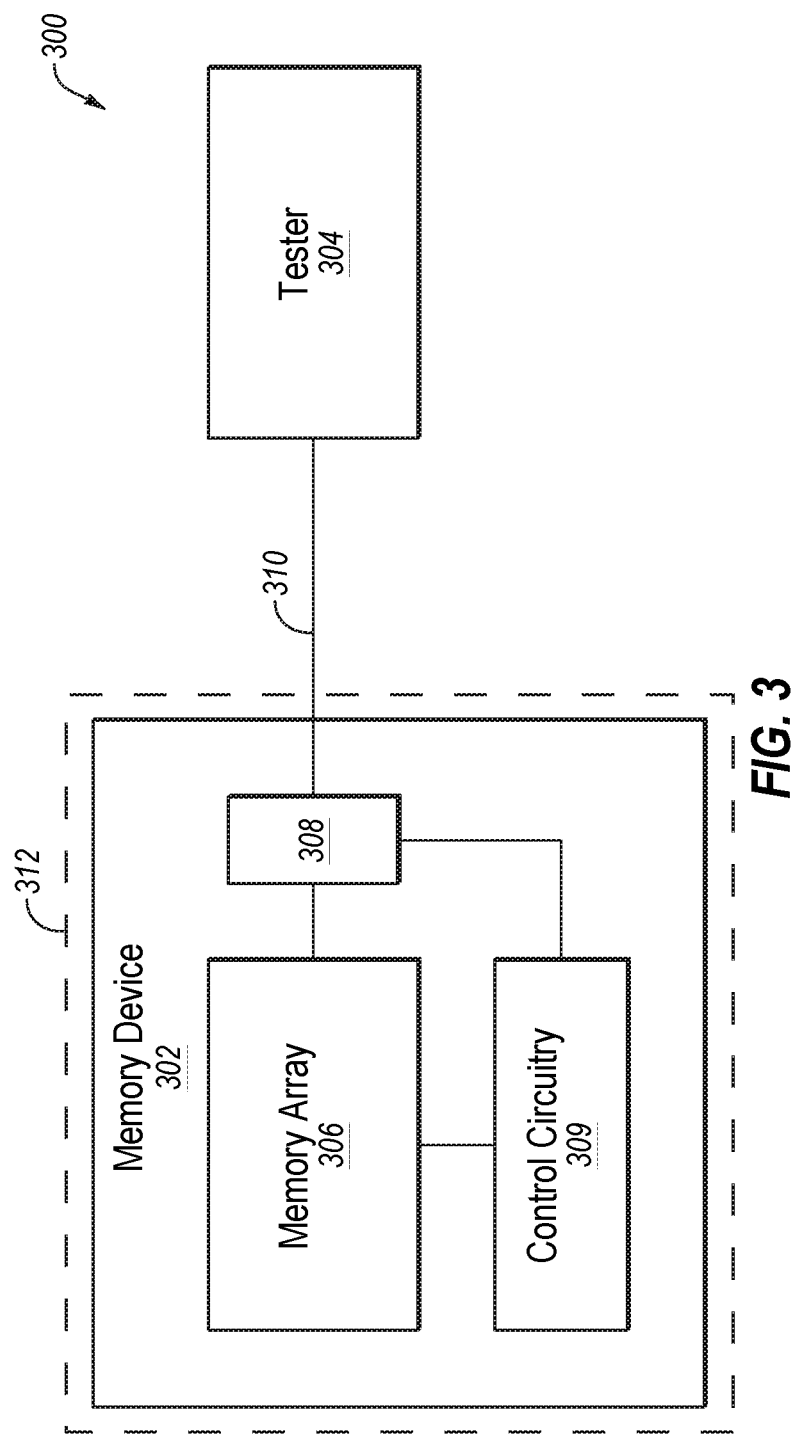
FIG. 3 depicts an example system including a tester, a memory device, and a buffer, according to various embodiments of the present disclosure.

FIG. 3 depicts an example system 300 including a memory device 302 and a tester 304 (also referred to herein as a "testing device"), in accordance with various embodiments of the present disclosure. Memory device 302 may include a memory array (e.g., memory cell array 102 of FIG. 1) 306. Further, memory device 302 includes a buffer 308. In at least some embodiments, buffer 308, which may also be referred to herein as a "cache," may be a first-in, first-out (FIFO) buffer. As will be appreciated in view of the embodiments disclosed herein, buffer 308 may include sufficient memory to store data related to failing bits (also referred to herein "failing memory addresses" or "failing memory cells") of memory array 306, and, in at least some embodiments, it may not be necessary for buffer 308 to store data related to passing bits (also referred to herein "passing memory addresses" or "passing memory cells") of memory array 306. For example, a size of buffer 308 may depend on a buffer overflow risk (e.g., per die). In some embodiments, a semiconductor die 312 may include memory device 302 and buffer 308. Further, although buffer 308 is illustrated as being within memory device 302, the disclosure is not so limited, and in some embodiments, buffer 308 may be external to memory device 302 (e.g., and positioned on semiconductor die 312).

Memory device 302 may further include control circuitry (e.g., control circuitry 109 of FIG. 1) 309 for carrying one or more of the embodiments disclosed herein. More specifically according to various embodiments of the present disclosure, control circuitry 309 and/or other circuitry of memory device 302 may (e.g., in response to one or more write and/or read operations) identify each memory address of a number of memory addresses of memory array 306 as either a pass or a fail. Stated another way, memory addresses associated with defective ("bad") memory cells may be identified as a "fail," and memory addresses associated with functional ("good") memory cells may be identified a "pass." Further, control circuitry 309 and/or other circuitry of memory device 302 may be configured to store, for each identified fail, data associated with the identified fail (e.g., an address of a failed memory cell, encoded data that identifies a failed address, and/or which bits of an address failed) in buffer 308, and convey, to tester 304 (i.e., via I/O line 310), at least some of the data associated with each identified fail. According to various embodiments, it is not required to convey address data associated with each identified pass (i.e., data associated with and/or identifying pass addresses or cells) to tester 304.

According to some embodiments, fail data (e.g., data including memory address information and/or which bits of a memory address failed) may be buffered on buffer 308. For example, one address per read may be stored in buffer 308. In some non-limiting examples, the fail data may include all information for an associated read, including prefetch fail information. Alternatively, or in addition, the fail data may include an encoded representation of a fail and/or a fail count. Further, in these and other embodiments, multi-read compression or encoded column plane compression may be used. Stated another way, fail data information may be encoded and logged in buffer 308. Further, in some embodiments, additional information about a fail may be stored as separate bits (e.g., to allow the combination of multiple addresses into one fail register). However, this may increase the chances of having failures in both locations and losing specific information associated with the fail (e.g., due to collisions) Potential collisions may be weighed versus the increased test time (i.e., without collision risk).

Moreover, according to various embodiments, in response to failing reads (i.e., read operations associated with at least one defective memory cell), fail data may be conveyed from memory device 302 (e.g., from buffer 308) to tester 304 (e.g., via at least one input/output (I/O) circuit). Further, in at least some embodiments, in response to passing reads (i.e., read operations not associated with at least one defective memory cell), additional fail data (e.g., data associated with previous fails), may be conveyed from memory device 302 (e.g., from buffer 308) to tester 304 (e.g., via at least one input/output (I/O) circuit). Further, in some embodiments, as described more fully below, some fail data (e.g., address information) may be conveyed from memory device 302 (e.g., from buffer 308) to tester 304 serially. In other embodiments, as also described more fully below, tester 304 may be configured to align fail data to an associated address based on an order in which the fail data is received.

Non-limiting example methods of testing a memory device, including processing, storing, and conveying fail data to a tester, will now be described in more detail with reference to FIGS. 3, 4A, 4B, and 5. In a first example method of processing, storing, and transferring fail data (also referred to herein as "method A"), address information is not stored in buffer 308 or conveyed from memory device 302 to tester 304. Rather, every pass and fail is indicated or represented in a stream of data (e.g., either a data burst or a continuous stream of data), which may be stored on buffer 308 and conveyed to tester 304. Further, tester 304 is configured to align address information with the data received from buffer 308. In other words, tester 304 is configured to sync incoming data with a specific memory address associated with a previously issued read command. Stated yet another way, tester 304 may send a read command to memory device 302 for a specific memory address, and in response thereto, memory device 302 may send a stream of data (e.g., a data burst) associated with the specific memory address. Further, as described more fully below, information included in the stream of data may enable tester 304 to track which memory address to associate with fail data.

More specifically, tester 304 may issue a read command for a specific memory address, which may include, for example, 128 bits. Data from memory array 306 may be read and compared to known data (e.g., data written to memory array 306 or data from an internal register) to identify fail and/or pass bits. If at least one of the 128 bits fail (i.e., at least one memory element fails (a "fail event")), a data burst (also referred to herein as a "burst of data") may start with a fail indicator bit (e.g., a binary "1"), and the remainder of the data burst may identify which bits of the 128 bits failed. Further, if each of the 128 bits pass, a data burst may start with a pass indicator bit (e.g., a binary "0"), and the remainder of the data burst may include a count value representing a number of consecutive passing bits (e.g., after a previous fail). In others words, the count value (i.e., a binary value) may indicate a number of consecutive passes (e.g., since the last fail event).

A more specific example (i.e., of method A) will now be described. It is noted that in this example, five read commands are issued, address 0 and address 4 fail (i.e., addresses 0 and 4 are associated with defective ("bad") memory elements), and addresses 1, 2, and 3 pass (i.e., addresses 1, 2, and 3 are associated with operable ("good") memory elements). Further, in this example, tester 304 may issue one read command at a time or more than one read command may be combined. In this example, at least one of the 128 bits (i.e., at least one memory element fails) of address 0 fails, and therefore, memory device 302 sends a burst of data starting with a fail indicator bit ("1"), and the remainder of the data burst (e.g., N bits) may identify which bits of the 128 bits of address 0 failed. Upon receipt of the data burst, tester 304 may align the burst of data with address 0. Further, in this example, each of the 128 bits of address 1 pass, and therefore, memory device 302 sends a burst of data starting with a pass indicator bit ("0"). The burst of data further includes a count of the number of consecutive passes (e.g., since a previous fail or since the first read). More specifically, in this example, the second burst of data may include "0 . . . 1", wherein the "0" is the pass indicator bit and the "1" is a binary representation of one (1) "pass" since the previous fail event (i.e., for address 0). Further, the third burst of data may include "0 . . . 10", wherein "0" is the pass indicator bit and "10" is a binary representation of two (2) "passes" since the previous fail event (i.e., for address 0). Also, in this example, the fourth burst of data may include "0 . . . 11", wherein the "0" is the pass indicator bit and the "11" is a binary representation of three (3) consecutive "passes" since the previous fail event (i.e., for address 0). Moreover, the fifth burst of data may include "1 . . . XX", wherein the "1" is a fail indicator bit and the "XX" identifies which bits of address 4 failed.

As will be understood by a person having ordinary skill in the art, based on the order of read commands issued by tester 304, and an order of data bursts received at tester 304, tester 304 may determine which memory address should be associated with which data burst.

As will be appreciated, if the volume of data sent to buffer 308 exceeds the storage capacity of buffer 308, a buffer overflow may occur. According to some embodiments, a buffer overflow may be considered a "pass," and in response to a buffer overflow, a data burst may begin with a pass indicator bit (e.g., "0"), and a count value (i.e., provided in the data burst) may be incremented, as described above. In some embodiments, in response to an overflow, or to prevent an overflow, additional "fails" may be treated as "passers" (i.e., if buffer 308 is full) and/or a multi-read compression scheme may be employed. In some embodiments, a test flow may be designed such that an occasional overflow and the associated false passers may be caught by accessing the array in a different order on a subsequent test (i.e., to log the failing bits that were ignored during the buffer overflow). Also, in some embodiments, one of the bits of a passing register (MSB or next bit after the initial ZERO) may be used to indicate that there was an overflow, and a tester (e.g., tester 304) may deal with that count of passers as all failing, or the tester may retest that portion.

As noted above, data may be conveyed from buffer 308 to tester 304 in a data burst or a continuous stream of data. More specifically, in some embodiments, data may be conveyed in a data burst in response to a read from tester 304. In these embodiments, tester 304 may be able to write to memory device 302 between reads. According to other embodiments in which data is transferred in a continuous stream (e.g., a single continuous stream), internal registers (i.e., internal to memory device 302) may write to memory device 302.

In various embodiments, a number of read operations (e.g., issued by tester 304) may be combined (e.g., bitwise "XORed" together in a multi-read compression) and attributed to the same address register in buffer 308. Moreover, in at least some embodiments, prefetch data may be compressed (e.g., via encoding) prior to being stored in buffer 308. For example, a 128 bits of prefetch data may be compressed to, for example, 16 bits (e.g., for global column repair), 8 bits, or any other suitable value.

Figure 4B:
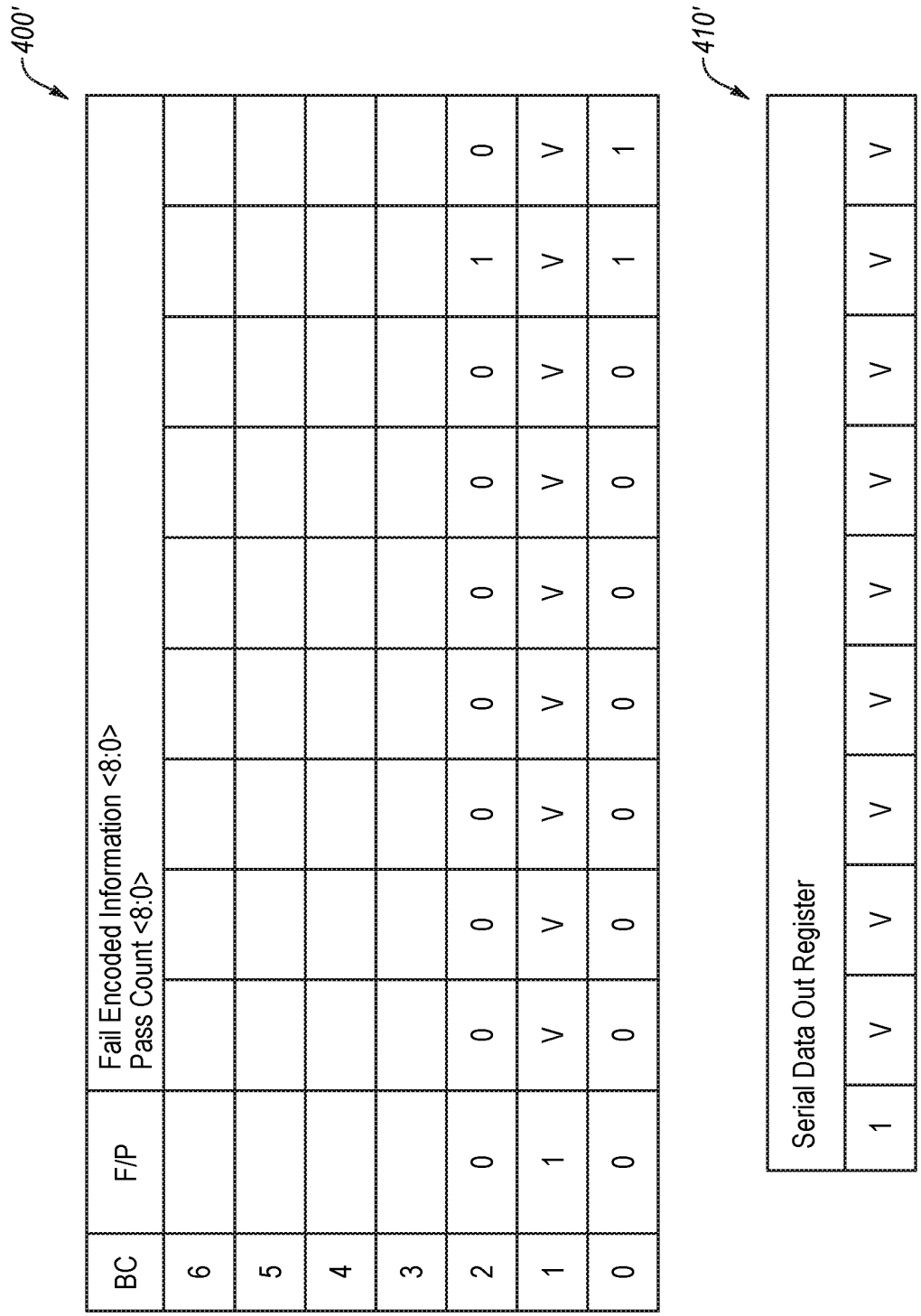

FIGS. 4A and 4B are example illustrations depicting snapshots of data within buffer 308, in accordance with various embodiments of the disclosure. More specifically, FIG. 4A depicts a snapshot of data within buffer 308 at a time (e.g., time=t1), and FIG. 4B depicts a snapshot of data within buffer 308 at a subsequent time (e.g., time=t2).

FIG. 4A depicts a table 400 including a number rows, wherein each row includes a burst count (BC), an indicator bit (i.e., for a fail/pass (F/P) column), and a number of bits for fail information or a pass count. For example, for bit count 0, an indicator bit is "1" (i.e., indicating a fail), and each "V" represent valid fail data. For bit count 1, an indicator bit is "0" (i.e., indicating a pass), and a count indicating a number of consecutive passes is "000000011" (i.e., indicating 4 consecutive passes since the last fail). Further, for bit count 2, an indicator bit is "1" (i.e., indicating a fail), and each "V" represents valid fail data. For bit count 3, an indicator bit is "0" (i.e., indicating a pass), and a count indicating a number of consecutive passes is "000000001" (i.e., indicating 1 pass since the last fail).

FIG. 4A further depicts a table 410 including example bits within a serial data out register (e.g., of buffer 308 of FIG. 3). As will be appreciated, data from table 400 (i.e., data from the bottom row (i.e., bit count=0) of table 400) may be transferred to a serial data out register prior to being conveyed (e.g., to tester 304). In this example, a first bit of the serial data out register is an indicator bit (e.g., a "1" representing a fail), and "V" represents valid fail data.

FIG. 4B depicts a table 400' including a number rows, wherein each row includes a burst count (BC), an indicator bit (i.e., for a fail/pass (F/P) column), and a number of bits for fail information or a pass count. FIG. 4B further depicts a table 410' including example bits within a serial data out register (e.g., of buffer 308 of FIG. 3). As will be appreciated, the bottom row (i.e., bit count=0) of table 400 of FIG. 4A is now shown in the serial data out register of table 410' of FIG. 4B.

A second example method of processing, storing, and/or conveying fail data (also referred to herein as "method B") will now be described. In this example method, a number of read commands, including internal and external read commands, may occur. More specifically, in response to one or more internal read commands (i.e., a read command internal to memory device 302), data from memory array 306 may be read and compared to known data (e.g., data written to memory array 306 or data from an internal register) to identify each memory address of a number of memory addresses of memory array 306 as either a pass (a "pass address") or a fail (a "fail address"). In response to identification of a fail address, fail data, which in this embodiment may include full read address information and prefetch information for the fail address, may be stored in buffer 308. For example, the fail address information may be encoded (e.g., 2× compression (XORed), 4×, 8×, without limitation) or may include 1× representation (i.e., full visibility). Further, in response to another read command (e.g., an external read command), the next fail address in buffer 308 may be conveyed to tester 304 (e.g., in a data burst). In some embodiments, during the external read command, one or more additional internal read commands for one or more other memory addresses of memory array 306 may occur, and any address information for any identified fail addresses may be added to buffer 308.

In this embodiment, as noted above, full address information (i.e., the actual memory address of a failed memory element) may be stored in buffer 308 and conveyed to tester 304. Thus, in this embodiment, tester 304 is not required to determine which memory address should be associated with received fail data. In other words, in this embodiment, because tester 304 receives memory address information for a fail address, tester 304 is not required to determine and track which address is associated with received fail data.

It is noted that in this embodiment, because a data burst includes the full address information (i.e., the fail address and which bits have failed) a length of a data burst may be longer than a conventional compression read. For example, for a 16G memory device, 34 bits may be needed to represent each read address using an encoded column plane method and encoded prefetch bits. In this example, seven of the 34 bits may be prefetch bits and 1 bit may be an indicator bit.

Further, in various embodiments, a number of read operations may be combined (e.g., bitwise "XORed" together in a multi-read compression) and attributed to the same address register in buffer 308. These embodiments may requires a longer data burst and may increase the risk of collision, but a number of external read outs (i.e., to buffer 308) may be reduced.

Figure 5:
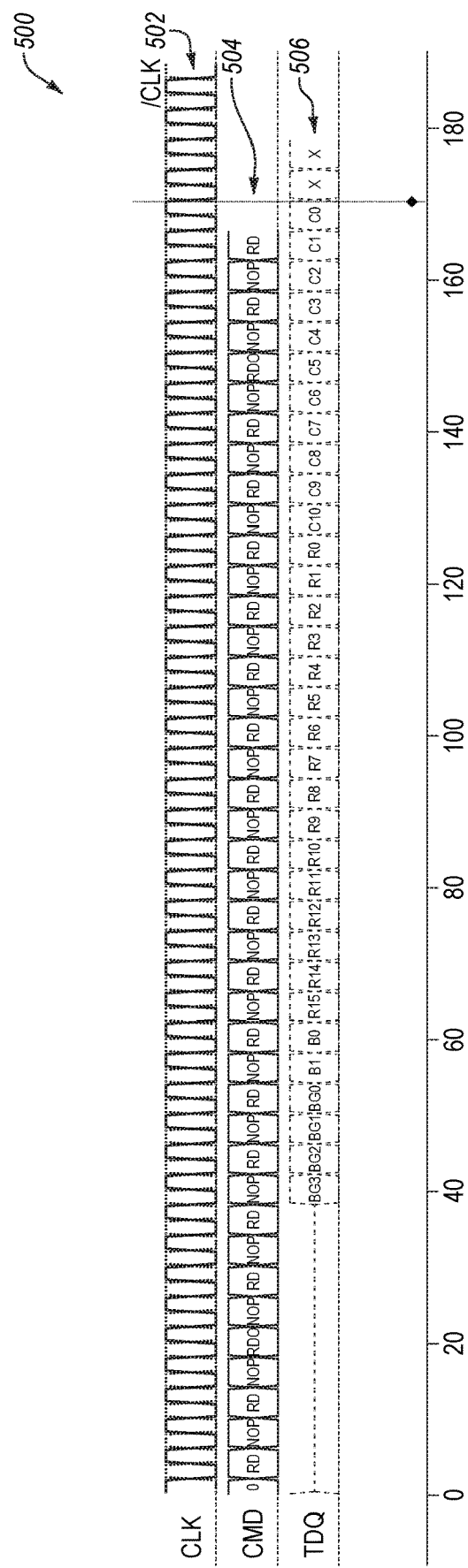
FIG. 5 depicts a timing diagram illustrating an example testing operation, according to various embodiments of the present disclosure.

FIG. 5 is a timing diagram 500 illustrating an example operation of method B described above. Timing diagram 500 includes a clock signal 502, a number of commands 504, and data 506 output from a memory device (e.g., memory device 302 of FIG. 3) to a tester (e.g., tester 304 of FIG. 3). As will be appreciated, data 506 includes full address information for a fail including bank group (BG), bank (B), row (R), and column (C) data. It is noted that data 506 is an example set of data, and in some embodiments, more or less data may be included in a data burst.

Yet another example method for processing, storing, and/or conveying fail data (also referred to herein as "method C") will now be described. In this example method, buffer 308 includes a serial FIFO buffer (e.g., single bit serial buffer). In this embodiment, data from memory array 306 may be read and compared to known data (e.g., data written to memory array 306 or data from an internal register) to identify each memory address of a number of memory addresses of memory array 306 as either a pass (a "pass address") or a fail (a "fail address"). In response to a fail address, fail data is stored in buffer 308. In this embodiment, the fail data, which may be encoded (e.g., 2×, 4×, 8×) or decoded (1×), is not required to include full address information.

Further, in this embodiment, in response to a read command, at least two bits are conveyed from memory device 302 to tester 304. A first bit transferred from memory device 302 to tester 304 includes an indicator bit that indicates whether a memory address associated with the read command passed or failed. For example, if the memory address failed, the first bit (i.e., the indicator bit) conveyed from memory device 302 to tester 304 may include a "1", and if the memory element passed, the first bit (i.e., the indicator bit) conveyed from memory device 302 to tester 304 may include a "0". The second bit transferred to tester 304 may include the next bit of fail data from buffer 308.

More specifically, for example, if address 0 is read (e.g., a first read operation) and fails, the first bit conveyed to tester 304 (i.e., in response to the read) would be a "1", and the second bit conveyed to tester 304 would be fail data associated with address 0 and stored in buffer 308. Continuing with this example, if address 1 is then read (e.g., a second read operation) and address 1 also fails, the first bit conveyed to tester 304 (i.e., in response to the second read operation) would be a "1", and the second bit conveyed to tester 304 would be the next bit of fail data stored in buffer 308 (e.g., fail data associated with address 0). Continuing with this example, if address 3 is then read (e.g., a third read operation) and address 3 passes, the first bit conveyed to tester 304 (i.e., in response to the third read operation) would be a 0, and the second bit conveyed to tester 304 would be the next bit of fail data stored in buffer 308 (e.g., fail data associated with address 0).

In this embodiment, tester 304 is configured to sync incoming data with a specific memory address. In other words, tester 304 may issue a read command for a specific memory address, and the next bit received (i.e., the first bit in response to the read command) indicates whether or not the specific memory address passed or failed. Stated yet another way, tester 304 may send a read command to memory device 302 for a specific memory address, and in response thereto, memory device 302 may convey data associated with the specific memory address. Further, as described more fully below, information included in the data may enable tester 304 to track which memory address to associate with fail data.

As will be appreciated, in this embodiment, "passes" allow tester 304 to "catch up" and receive fail data associated with previous fail addresses. As an example, if address 0 is read (e.g., a first read operation) and fails, the first bit conveyed to tester 304 (i.e., in response to the read) would be a "1", and the second bit conveyed to tester 304 would be fail data associated with address 0 and stored in buffer 308. Further, if each of addresses 1-10 are read and pass (e.g., in response to 10 read operations), the first bit in each bit sequence conveyed to tester 304 responsive to each of the 10 reads would be a "0", and the second bit in each bit sequence conveyed to tester 304 responsive to each of the 10 reads would be the next bit of fail data in buffer 308 (i.e., fail data associated with address 0). Thus, "passes" allow data associated with previous fails to be conveyed from memory device 302 to buffer 308. It is noted that if buffer 308 is empty, the second bit of a bit sequence conveyed to tester 304 (i.e., responsive to one or more of the 10 read commands) may be a 0. In this embodiment, data is transferred to tester 304 in response to a read command, and thus other operations (e.g., write operations) may occur (e.g., between read operations).

In at least this embodiment, tester 304 may know that each fail may include a known number of bits. Thus, in response to a fail, tester 304 may count data bits (second bit of the burst) and associate the bits with the first failing address until all the data bits for that fail have been transferred. If another fail occurred during the transfer time, it may be assumed that the failing information for the next fail will immediately begin to stream out (i.e., during the second bit). Tester 304 may associate the data with the second failing address (i.e., based on when the first bit failed in the test). If no additional fails occur during the transfer of failing data, tester 304 may not log any of the data bits and tester 304 may wait for the next fail (i.e., first bit to be 1). In response to another fail, tester 304 may again count the data bits and associate the data bits with the fail. Thus, generally, the first bit indicates the address based on which address was read to create the fail. That address is stored in a buffer (e.g., FIFO) on tester 304 and tester 304 applies the addresses to the data as the data is received.

As will be appreciated, various embodiments described herein (e.g., method A, method B, and/or method C) may reduce test time (e.g., at burn), and may allow for reads at a maximum design supported test clock. Further, various embodiments may allow for 1× visibility (e.g., for read of ECC collision bits). In these embodiments, data may be compared to data in an on-die register to achieve 1× visibility (e.g., using XOR compares). Further, some embodiments disclosed herein may allow for other repair schemes that are not currently viable because of reduced compression. Also, some embodiments may allow for additional data compression (e.g., bank group compression). Further, in embodiments wherein a memory built-in self-test (MBIST) includes a separate clock (e.g., an internal oscillator), a faster clock may be run on a slower tester, and a data stream may be outputted at a slower speed. Also, various embodiments may allow for spanning multiple clocks per address bit (e.g., to run at faster test clocks) during repair tests (e.g., to reduce test time at burn).

Figure 6:
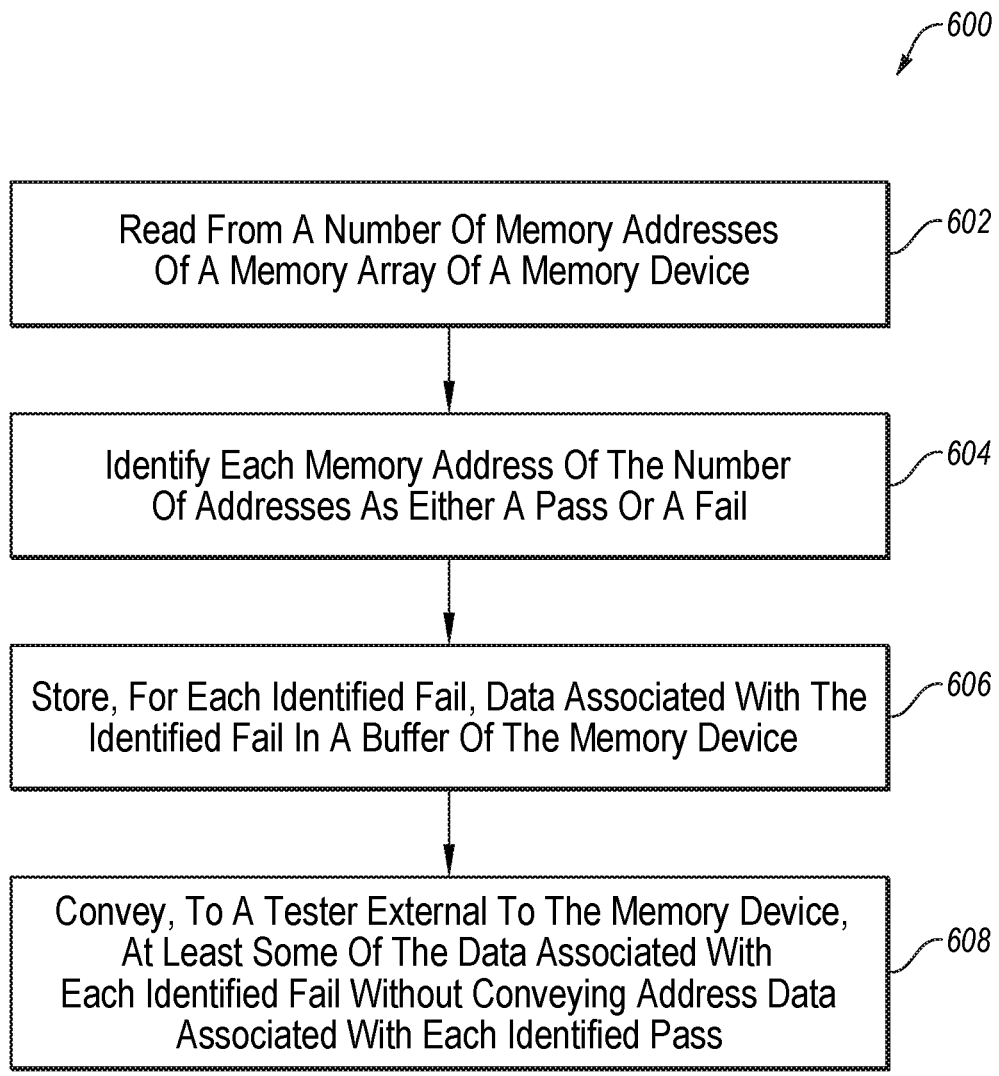
FIG. 6 is a flowchart of an example method of testing a memory device, in accordance with various embodiments of the present disclosure.

FIG. 6 is a flowchart of an example method 600 of testing a memory device, in accordance with various embodiments of the disclosure. Method 600 may be arranged in accordance with at least one embodiment described in the present disclosure. Method 600 may be performed, in some embodiments, by a device or system, such as memory device 100 of FIG. 1, system 300 of FIG. 3, memory device 302 of FIG. 3, a memory system 700 of FIG. 7, or another device or system. Although illustrated as discrete blocks, various blocks may be divided into additional blocks, combined into fewer blocks, or eliminated, depending on the desired implementation.

Method 600 may begin at block 602, wherein data may be read from a number of memory addresses of a memory array of a memory device, and method 600 may proceed to block 604. For example, with reference to FIG. 3, in response to a read command (e.g., issued by tester 304 of FIG. 4), data may be read from a number of memory addresses of memory array 306.

At block 604, each memory address of the number of addresses may be identified as either a pass or a fail, and method 600 may proceed to block 606. For example, data read from memory addresses of memory array 306 may be compared to known data (e.g., data written to memory array 306 or data from an internal register) to identify each memory addresses of the number of memory addresses as either pass addresses of fail addresses.

At block 606, for each identified fail, data associated with the identified fail may be stored in a buffer on the memory device, and method 600 may proceed to block 608. For example, data associated with the identified fail may be stored in buffer 308 of FIG. 3. In some embodiments, an indicator bit and either fail data identifying each fail bit of the identified fail or a count indicating a number of consecutive identified passes may be stored in the buffer. In other embodiments, a memory address for the identified fail may be stored in the buffer. In yet other embodiments, fail data identifying each fail bit of the identified fail may be stored in the buffer.

At block 608, at least some of the data associated with each identified fail may be conveyed from the memory device to a tester without conveying address data associated with each identified pass. For example, with reference to FIG. 3, at least some of the data associated with each identified fail may be conveyed from memory device 302 to tester 304. In some embodiments, an indicator bit and either fail data identifying each fail bit of the identified fail or a count indicating a number of successive identified passes may be stored. In other embodiments, a memory address for the identified fail may be conveyed from the buffer to the tester. In yet other embodiments, data identifying each fail bit of the identified fail may be conveyed from the buffer to the tester.

Modifications, additions, or omissions may be made to method 600 without departing from the scope of the present disclosure. For example, the operations of method 600 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

Figure 7:
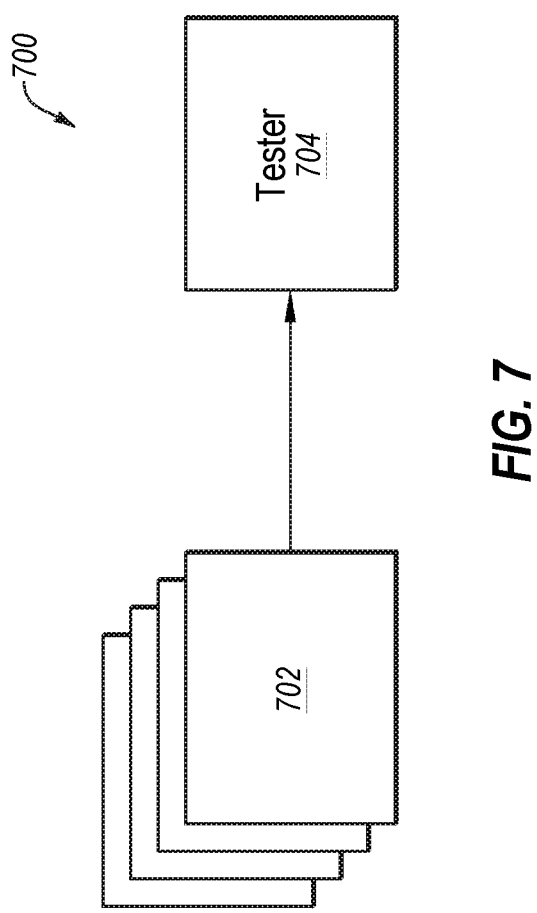
FIG. 7 is a simplified block diagram of a system, in accordance with various embodiments of the present disclosure.

A system is also disclosed. According to various embodiments, the system may include a tester and one or more memory devices (e.g., memory device 100 of FIG. 1) including one or more memory cell arrays. FIG. 7 is a simplified block diagram of a memory system 700 implemented according to one or more embodiments described herein. Memory system 700, which may include, for example, a memory testing system, includes a number of memory devices 702 and a tester 704, which may include, for example only, tester 304 (see FIG. 3), as described herein. Tester 704 may be operatively coupled with memory devices 702, wherein each memory device 702 may include, or may be coupled to circuitry for carrying out one or more embodiments disclosed herein.

Various embodiments of the present disclosure may include a method of testing a memory device. The method may include reading from a number of memory addresses of a memory array of the memory device and identifying each memory address of the number of addresses as either a pass or a fail. The method may further include storing, for each identified fail, data associated with the identified fail in a buffer of the memory device. Further, the method may include conveying, to a tester external to the semiconductor die, at least some of the data associated with each identified fail without conveying address data associated with each identified pass to the tester.

According to another embodiment of the present disclosure, a device may include a memory array and a buffer coupled to the memory array. The device may further include circuitry coupled to the memory array and the buffer and configured to read data from a number of memory addresses of the memory array. The circuitry may also be configured to compare the read data to known test data. Further, the circuitry may be configured to, responsive to the comparison, identify each memory address of the number of memory addresses as either a pass or a fail. Also, the circuitry may be configured to store, for each identified fail, data associated with the identified fail in the buffer. The circuitry may further be configured to convey, to an external tester, at least some of the data associated with each identified fail without conveying address data associated with each identified pass to the external tester.

Additional embodiments of the present disclosure include a system. The system may include a testing device and at least one memory device operably coupled to the testing device. The memory device may include a memory array comprising a number of memory addresses. The memory device may also include a first-in, first-out (FIFO) cache and at least one circuit. The at least one circuit may be configured to identify, responsive to at least one test operation, each memory address of the number of memory addresses as either a pass or a fail. The at least one circuit may also be configured to store, for each identified fail, a number of fail data bits associated with the identified fail in the FIFO cache. Further, the at least one circuit may be configured to convey, to the testing device, at least some of the number of fail data bits associated with each identified fail without conveying address data associated with each identified pass to the testing device.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A method of testing a memory device, comprising:
   reading from a number of memory addresses of a memory array of the memory device;
   identifying each memory address of the number of memory addresses as either a pass or a fail;
   storing, for each identified fail, data associated with the identified fail in a buffer of the memory device; and
   conveying, to a tester external to the memory device, at least some of the data associated with each identified fail without conveying address data associated with each identified pass to the tester.

2. The method of claim 1, wherein storing the data associated with each identified fail comprises storing, for each identified fail, a fail indicator bit and fail data identifying each fail bit of the identified fail.

3. The method of claim 2, wherein conveying comprises conveying the fail indicator bit and the fail data from the buffer to the tester.

4. The method of claim 2, further comprising storing, for each identified pass, a pass indicator bit and a count indicating a number of consecutive identified passes.

5. The method of claim 4, further comprising conveying the pass indicator bit and the count from the buffer to the tester.

6. The method of claim 1, wherein storing the data associated with each identified fail comprises storing, for each identified fail, a memory address for the identified fail.

7. The method of claim 6, wherein conveying comprises conveying the memory address for the identified fail from the buffer to the tester.

8. The method of claim 1, wherein storing the data associated with each identified fail comprises storing, for each identified fail, fail information identifying each fail bit of the identified fail.

9. The method of claim 8, wherein conveying comprises conveying, to the tester, a pass indicator bit or fail indicator bit and at least a next bit of the fail information stored in the buffer.

10. A device, comprising:
    a memory array;
    a buffer coupled to the memory array; and
    circuitry coupled to the memory array and the buffer and configured to:
       read data from a number of memory addresses of the memory array;
       compare the read data to known test data;
       responsive to the comparison, identify each memory address of the number of memory addresses as either a pass or a fail;
       store, for each identified fail, data associated with the identified fail in the buffer; and
       convey, to an external tester, at least some of the data associated with each identified fail without conveying address data associated with each identified pass to the external tester.

11. The device of claim 10, wherein the buffer comprises a first-in, first-out (FIFO) buffer.

12. The device of claim 10, wherein the circuitry is further configured to:
    store, for each identified fail, a fail indicator bit and fail information identifying each fail bit of the identified fail in the buffer;
    convey the fail indicator bit and the fail information from the buffer to the external tester;
    store, for each identified pass, a pass indicator bit and a count indicating a number of consecutive identified passes in the buffer; and
    convey the pass indicator bit and the count from the buffer to the external tester.

13. The device of claim 10, wherein the circuitry is further configured to:
    store, for each identified fail, a memory address for the identified fail in the buffer; and
    convey the memory address for the identified fail from the buffer to the external tester.

14. The device of claim 10, wherein the buffer comprises a serial buffer.

15. The device of claim 14, wherein the circuitry is further configured to:
    store, for each identified fail, fail information identifying each fail bit of the identified fail in the serial buffer; and
    convey, to the external tester, a pass or fail indicator bit and at least a next bit of the fail information stored in the serial buffer.

16. A system, comprising:
    a testing device; and
    at least one memory device operably coupled to the testing device and comprising:
       a memory array comprising a number of memory addresses;
       a first-in, first-out (FIFO) cache; and
       at least one circuit configured to:
    identify, responsive to at least one test operation, each memory address of the number of memory addresses as either a pass or a fail;
    store, for each identified fail, a number of fail data bits associated with the identified fail in the FIFO cache; and
    convey, to the testing device, at least some of the number of fail data bits associated with each identified fail without conveying address data associated with each identified pass to the testing device.

17. The system of claim 16, wherein the at least one circuit is further configured to: store, in the FIFO cache, for each identified fail, a first indicator bit and fail data identifying each fail bit of the identified fail;
    convey the first indicator bit and the fail data to the testing device;
    store, in the FIFO cache, for each identified pass, a second, different indicator bit and a count value indicating a number of consecutive identified passes; and
    convey the second, different indicator bit and the count value to the testing device.

18. The system of claim 16, wherein the at least one circuit is configured to convey the at least some of the number of fail data bits in a data burst or a single stream of data.

19. The system of claim 16, wherein:
in response to a first read command, the at least one circuit is configured to store a memory address for the identified fail in the FIFO cache; and
in response to a second read command, the at least one circuit is configured to convey the memory address for the identified fail to the testing device.

20. The system of claim 16, wherein the at least one circuit is further configured to: store, for each identified fail, data identifying each fail bit of the identified fail in the FIFO cache;
and convey, to the testing device, a pass or fail indicator bit and at least a next bit of the number of fail data bits stored in the FIFO cache.

* * * * *